(12) United States Patent
Aimono et al.

(10) Patent No.: US 11,648,774 B2
(45) Date of Patent: May 16, 2023

(54) PIEZOELECTRIC ACTUATOR, LIQUID EJECTING HEAD, AND LIQUID EJECTING APPARATUS

(71) Applicant: Seiko Epson Corporation, Tokyo (JP)

(72) Inventors: Takanori Aimono, Matsumoto (JP); Eiju Hirai, Azumino (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/005,508

(22) Filed: Aug. 28, 2020

(65) Prior Publication Data

US 2021/0060946 A1 Mar. 4, 2021

(30) Foreign Application Priority Data

Aug. 30, 2019 (JP) .............................. JP2019-157933

(51) Int. Cl.
  *B41J 2/14* (2006.01)
  *H01L 41/047* (2006.01)
  *H01L 41/09* (2006.01)

(52) U.S. Cl.
  CPC ...... *B41J 2/14201* (2013.01); *H01L 41/0475* (2013.01); *H01L 41/0477* (2013.01); *H01L 41/0478* (2013.01); *H01L 41/0973* (2013.01)

(58) Field of Classification Search
  None
  See application file for complete search history.

(56) References Cited

U.S. PATENT DOCUMENTS

| | | | |
|---|---|---|---|
| 2010/0218607 A1* | 9/2010 | Kazama | G01P 15/18 73/514.33 |
| 2013/0027477 A1* | 1/2013 | Guan | B41J 2/1646 29/25.35 |
| 2017/0111026 A1* | 4/2017 | Yamamoto | H03H 9/02023 |
| 2018/0154634 A1* | 6/2018 | Nakakubo | B41J 2/1628 |
| 2018/0154652 A1* | 6/2018 | Yazaki | B41J 2/055 |
| 2018/0170052 A1 | 6/2018 | Menzel et al. | |

FOREIGN PATENT DOCUMENTS

WO 2018-118774 A1 6/2018

\* cited by examiner

*Primary Examiner* — Erica S Lin
(74) *Attorney, Agent, or Firm* — Harness, Dickey & Pierce, P.L.C.

(57) ABSTRACT

A piezoelectric actuator includes: a diaphragm plate; a first electrode provided on or over the diaphragm plate; a piezoelectric substance layer provided on or over the first electrode; and a second electrode provided on or over the piezoelectric substance layer; wherein the piezoelectric substance layer includes a plurality of active portions sandwiched between the first electrode and the second electrode, either one of the first electrode and the second electrode is an individual electrode provided individually for each of the plurality of active portions, the other of the first electrode and the second electrode is a common electrode that is common to the plurality of active portions, and lead-out wiring is multiple-connected to the individual electrode.

12 Claims, 9 Drawing Sheets

PIEZOELECTRIC ACTUATOR, LIQUID EJECTING HEAD, AND LIQUID EJECTING APPARATUS

The present application is based on, and claims priority from JP Application Serial Number 2019-157933, filed Aug. 30, 2019, the disclosure of which is hereby incorporated by reference herein in its entirety.

BACKGROUND

1. Technical Field

Embodiments of the present disclosure relate to a piezoelectric actuator, a liquid ejecting head provided with a piezoelectric actuator, and a liquid ejecting apparatus provided with a liquid ejecting head.

2. Related Art

A liquid ejecting head of related art has the following structure. A diaphragm plate is provided on a flow passage forming substrate in which pressure chambers are formed. A piezoelectric actuator configured as a stack of a first electrode, a piezoelectric substance layer, and a second electrode is provided on the diaphragm plate.

Also proposed in related art is a liquid ejecting head provided with a piezoelectric actuator whose active portion is provided annularly along the wall of a pressure chamber, without providing the active portion serving practically as the driver of the piezoelectric actuator at the center region of a diaphragm, for example, as disclosed in International Publication No. 2018/118774.

However, if the thickness of an individual electrode is decreased, a voltage drop occurs on a remote side away from a lead electrode with respect to a side of supply from the lead electrode. This causes an imbalance in the distribution of the intensity of an electric field applied to the active portion, resulting in crack damage or burn damage, etc.

On the other hand, if the thickness of the individual electrode is increased so as to prevent a voltage drop of the individual electrode, the thick individual electrode will be obstructive to the deformative actuation of the piezoelectric actuator, resulting in lower efficiency in deformation, meaning that a large amount of deformative action cannot be obtained with a low voltage.

These problems are not limited to a piezoelectric actuator used in a liquid ejecting head, a typical example of which is an ink jet recording head. The same problems happen to piezoelectric actuators used in other kinds of devices.

SUMMARY

An advantage of some aspects of the present disclosure is to provide a piezoelectric actuator, a liquid ejecting head, and a liquid ejecting apparatus that prevents crack damage or burn damage to each layer and prevents a decrease in deformation efficiency.

A certain aspect of the present disclosure is a piezoelectric actuator that includes: a diaphragm plate; a first electrode provided on or over the diaphragm plate; a piezoelectric substance layer provided on or over the first electrode; and a second electrode provided on or over the piezoelectric substance layer; wherein the piezoelectric substance layer includes a plurality of active portions sandwiched between the first electrode and the second electrode, either one of the first electrode and the second electrode is an individual electrode provided individually for each of the plurality of active portions, the other of the first electrode and the second electrode is a common electrode that is common to the plurality of active portions, and lead-out wiring is multiple-connected to the individual electrode.

Another aspect of the present disclosure is a liquid ejecting head that includes the piezoelectric actuator according to the above aspect.

Still another aspect of the present disclosure is a liquid ejecting apparatus that includes the liquid ejecting head according to the above aspect.

DESCRIPTION OF EXEMPLARY EMBODIMENTS

Some embodiments of the present disclosure will now be explained in detail. The description below merely shows a certain aspect of the present disclosure. As such, the described aspect may be modified as needed within the scope of the present disclosure. In the figures, the same members are labeled with the same reference numerals, and description of the same members will be omitted below. In the figures, X, Y, and Z represent three spatial axes orthogonal to one another. In this specification, directions along these axes are defined as X, Y, and Z directions. The direction indicated by an arrowhead in each figure will be described as a positive direction (+). The opposite direction will be described as a negative direction (−). The Z direction is a vertical direction, wherein +Z denotes vertically downward, and −Z denotes vertically upward.

First Embodiment

Figure 1:
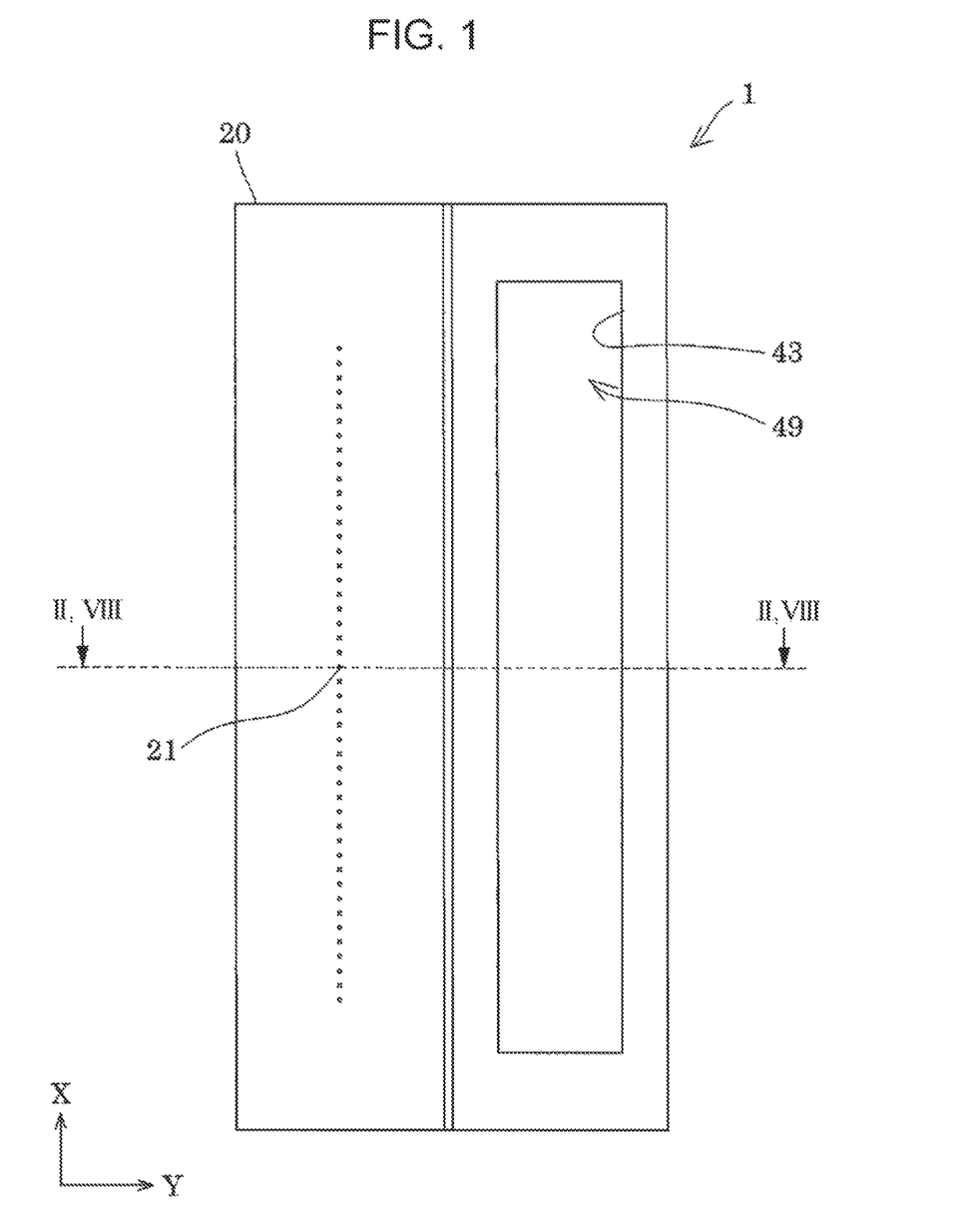
FIG. 1 is a plan view of a recording head according to a first embodiment of the present disclosure.
Figure 2:
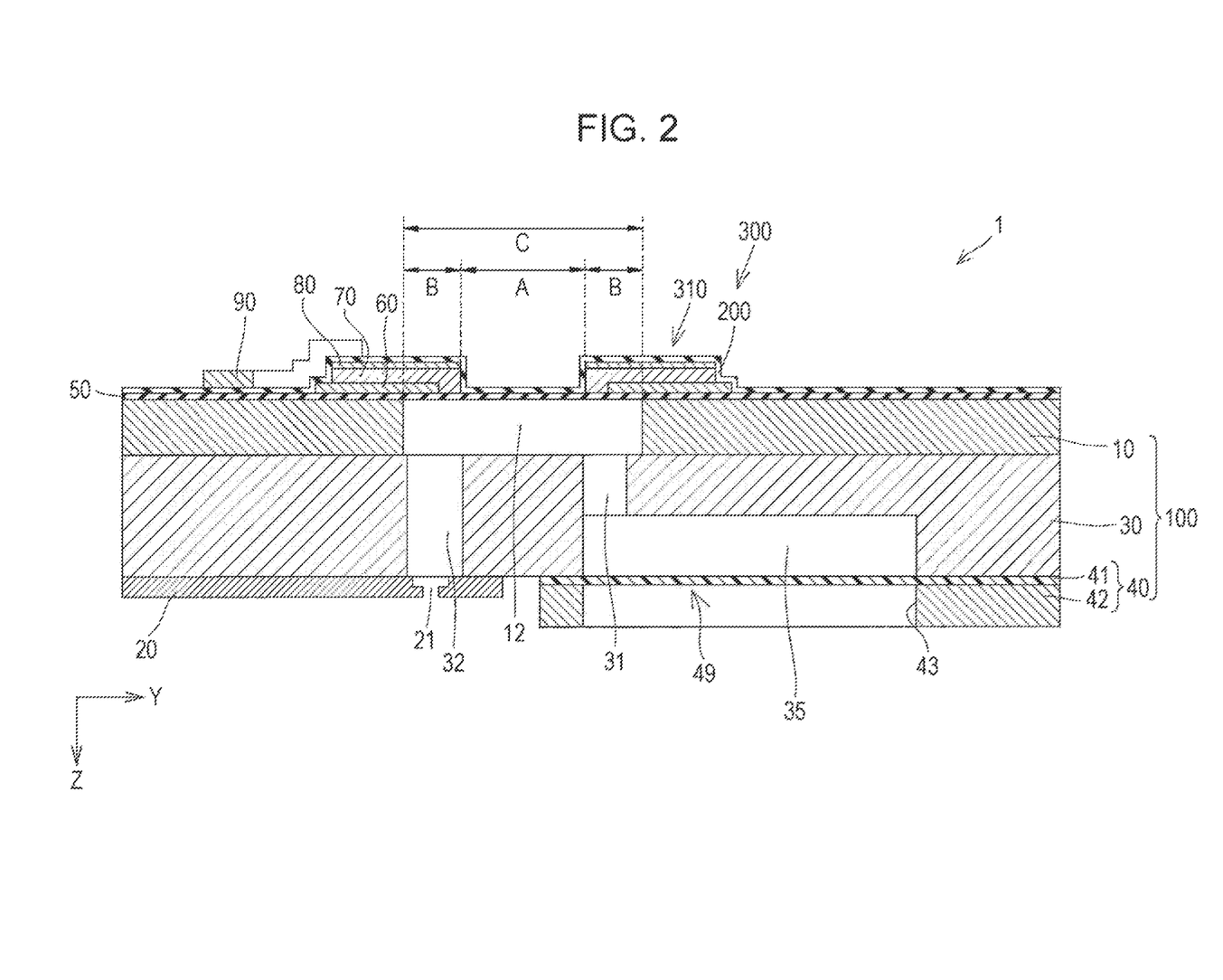
FIG. 2 is a sectional view of the recording head according to the first embodiment of the present disclosure.
Figure 3:
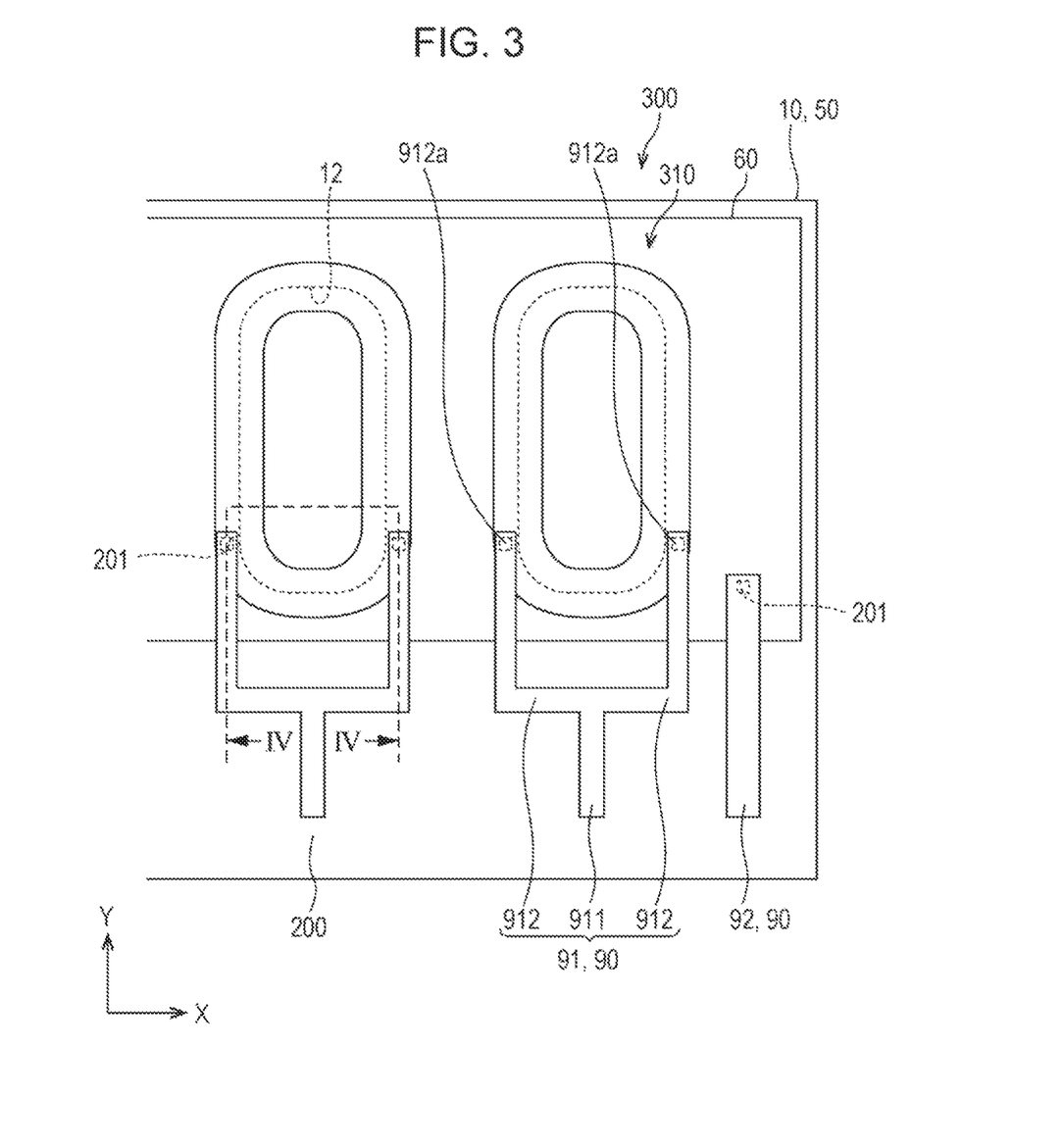
FIG. 3 is a plan view of a piezoelectric actuator according to the first embodiment of the present disclosure.
Figure 4:
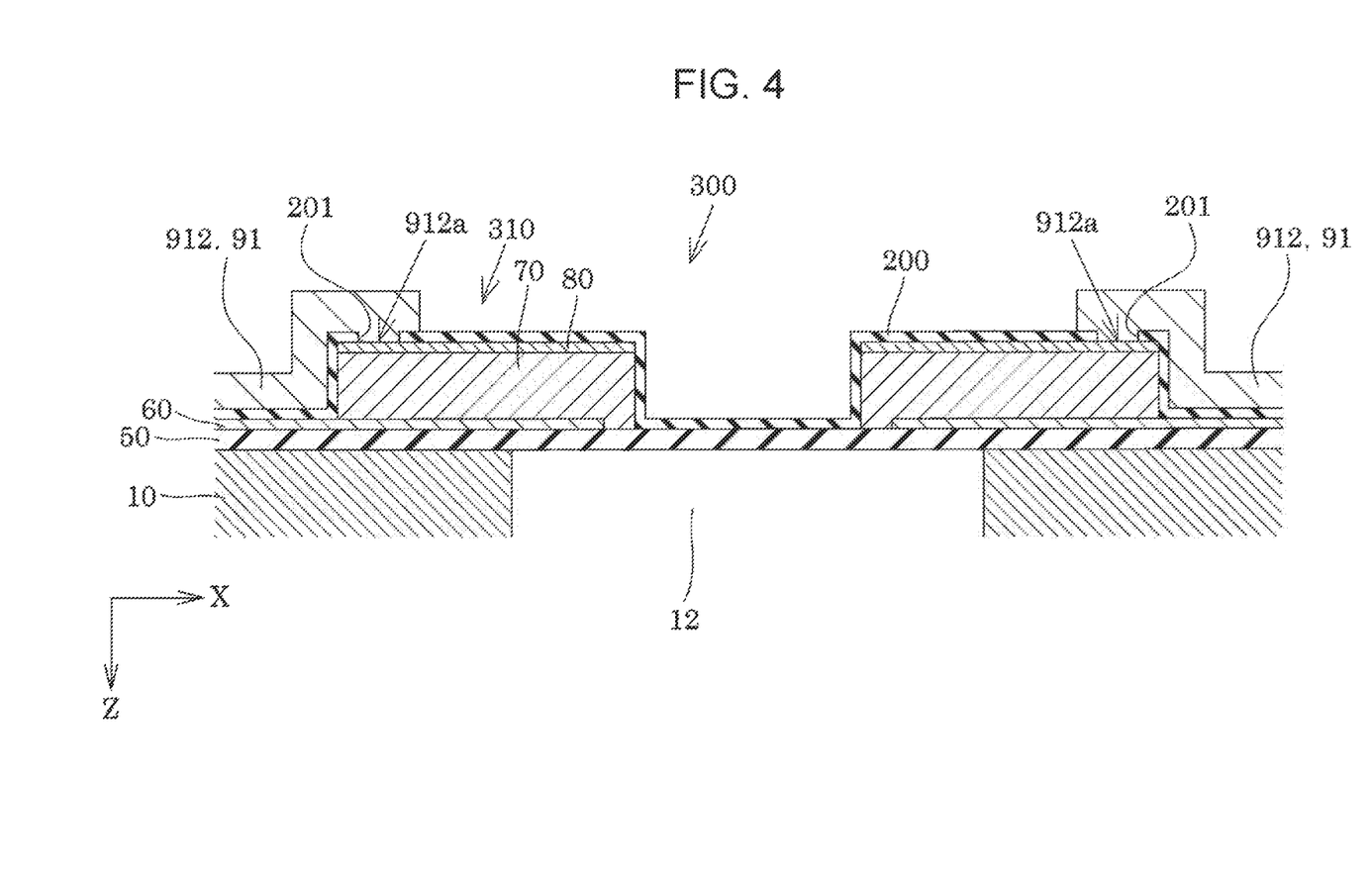
FIG. 4 is an enlarged sectional view of a key part of the recording head according to the first embodiment of the present disclosure.

FIG. 1 is a plan view of an ink jet recording head that is an example of a liquid ejecting head according to a first embodiment of the present disclosure. FIG. 2 is a sectional view taken along the line II-II of FIG. 1. FIG. 3 is an enlarged plan view of a key part of a piezoelectric actuator. FIG. 4 is a sectional view taken along the line IV-IV of FIG. 3.

As illustrated in the figures, a recording head 1 includes a flow passage unit 100 and a piezoelectric actuator 300. The flow passage unit 100 according to the present embodiment includes a flow passage forming substrate 10, a common liquid chamber substrate 30, a nozzle plate 20, and a compliance substrate 40.

The flow passage forming substrate 10 is made of a silicon substrate, a glass substrate, an SOI substrate, or various kinds of a ceramic substrate.

The flow passage forming substrate 10 has a plurality of pressure chambers 12 formed next to one another in the X direction. The pressure chambers 12 are arranged in a line in the X direction at the same Y-directional position. Needless to mention, the arrangement of the pressure chambers 12 is not limited to such linear arrangement. For example, a so-called zigzag layout, in which every other pressure chamber 12 of the array in the X direction is at a position shifted in the Y direction to form a staggered pattern, may be adopted.

The shape of the pressure chamber 12 according to the present embodiment in a plan view taken along the Z direction, that is, its opening shape as viewed in the Z direction, is a corner-rounded rectangle that is a kind of a modification from a basic rectangular shape whose longer sides extend in the Y direction but has arches at the length-directional ends thereof (also known as a ellipseshape). That is, in a plan view taken along the Z direction, the pressure chamber 12 has a modified rectangular shape whose longer-side direction is the Y direction and whose shorter-side direction is the X direction. Since the pressure chamber 12 has such a modified rectangular shape, when plural pressure chambers 12 are arranged next to one another in the shorter-side direction, it is possible to reduce the head size without sacrificing the capacity of each pressure chamber 12.

Needless to mention, the shape of the pressure chambers 12 in a plan view taken along the Z direction is not limited to the above example. For example, the shape may be a square, a rectangle, a polygon, a parallelogram, a sector, a circle, or an elongated hole. The shape of "an elongated hole" includes an ellipse, and a shape like an ellipse, for example, an oblong shape, an egg shape, or an elongated circular shape, to name but a few.

The common liquid chamber substrate 30 and the nozzle plate 20 are stacked in this order on the +Z side with respect to the flow passage forming substrate 10.

The common liquid chamber substrate 30 is a substrate in which a common liquid chamber 35 is formed. The common liquid chamber 35 is in communication with each of the pressure chambers 12. The common liquid chamber substrate 30 is provided on the +Z-side (positive Z-side) surface of the flow passage forming substrate 10. The common liquid chamber 35 has a size of extending continuously in the X direction from an end to an end of the plurality of pressure chambers 12. In a plan view taken along the Z direction, the common liquid chamber 35 is formed at a position of overlapping with the Y-directional end portion of each pressure chamber 12. The common liquid chamber 35 is provided by forming a cavity in +Z-side surface of the common liquid chamber substrate 30.

The common liquid chamber substrate 30 has a plurality of first flow passages 31 communicating with Y-directional one end portion of the pressure chambers 12. The first flow passage 31 is an individual passage provided independently for each of the plurality of pressure chambers 12. The first flow passage 31 provides communication between the common liquid chamber 35 and the pressure chamber 12 in the Z direction such that ink in the common liquid chamber 35 is supplied to the pressure chamber 12 through the first flow passage 31.

The common liquid chamber substrate 30 has a plurality of second flow passages 32 for communication between the pressure chambers 12 and nozzles 21. The second flow passage 32 is provided as a through-hole passage formed through the common liquid chamber substrate 30 in the Z direction for connecting from the pressure chamber 12 to the nozzle 21.

The common liquid chamber substrate 30 may be made of a silicon substrate, a glass substrate, an SOI substrate, or various kinds of a ceramic substrate, or a metal substrate such as a stainless substrate, to name but a few. A material that has substantially the same coefficient of thermal expansion as that of the flow passage forming substrate 10 may be used for the common liquid chamber substrate 30. Using a material that has substantially the same coefficient of thermal expansion as that of the flow passage forming substrate 10 for the common liquid chamber substrate 30 reduces the risk of warping caused due to the difference between the coefficients of thermal expansion when heat is applied.

With respect to the common liquid chamber substrate 30, on one side of which the flow passage forming substrate 10 is provided, the nozzle plate 20 is provided on the opposite side. Namely, the nozzle plate 20 is provided on the +Z-side surface of the common liquid chamber substrate 30.

The nozzle plate 20 has a plurality of nozzles 21 for ejecting ink in the +Z direction. In the present embodiment, as illustrated in FIG. 1, the nozzles 21 are arranged in a line in the X direction. That is, the nozzles 21 are arranged at the same Y-directional position. Needless to mention, the arrangement of the nozzles 21 is not limited to such linear arrangement. For example, a so-called zigzag layout, in which every other nozzle 21 of the array in the X direction is at a position shifted in the Y direction to form a staggered pattern, may be adopted.

Examples of a material that may be used for the nozzle plate 20 include but not limited to: a silicon substrate, a glass substrate, an SOT substrate, various kinds of a ceramic substrate, a metal substrate such as a stainless substrate, an organic substance such as polyimide resin.

The compliance substrate 40 is provided on the +Z-side surface of the common liquid chamber substrate 30 having an opening of the common liquid chamber 35. The +Z-side opening of the common liquid chamber 35 is sealed with the compliance substrate 40. In the present embodiment, the compliance substrate 40 includes a sealing film 41, which is a flexible thin film, and a fixing substrate 42, which is made of a hard material such as metal. The fixing substrate 42 has an area corresponding to the area of the common liquid chamber 35, and, at this area, an opening 43 is formed as a space by complete removal in the thickness direction. Therefore, one side of the common liquid chamber 35 is a compliance portion 49, which is a flexible portion sealed solely with the sealing film 41 having flexibility. Since the compliance portion 49 is provided as a part of the wall of the common liquid chamber 35, it is possible to absorb changes in pressure of ink inside the common liquid chamber 35 by the deformation of the compliance portion 49.

An ink flow passage leading from the common liquid chamber 35 to the nozzle 21 through the first flow passage 31, the pressure chamber 12, and the second flow passage 32 is formed in the flow passage unit 100 having the structure described above. Ink is supplied to the common liquid chamber 35 from an external ink supply unit, though not illustrated. The ink supplied from the external ink supply unit flows into the common liquid chamber 35. Next, the ink is supplied from the common liquid chamber 35 to each pressure chamber 12 through the corresponding first flow passage 31. Due to the function of the piezoelectric actuator 300 described later, the ink in the pressure chamber 12 flows through the second flow passage 32 to be ejected from the nozzle 21.

A diaphragm plate 50 is provided on the −Z-side (negative Z-side) surface of the flow passage forming substrate 10, that is, the opposite of the side on which the common liquid chamber substrate 30 is provided. The diaphragm plate 50 is a flexible member made of a single layer, or made up of a plurality of layers, selected from among a silicon layer, a silicon dioxide layer, a silicon nitride layer, a zirconium oxide layer, and the like.

A first electrode 60, a piezoelectric substance layer 70, and a second electrode 80 are sequentially formed on the diaphragm plate 50 in layers in the −Z direction by a film deposition method or a lithography method. The diaphragm plate 50, the first electrode 60, the piezoelectric substance layer 70, and the second electrode 80 constitute the piezoelectric actuator 300 according to the present embodiment. In the present embodiment, the piezoelectric actuator 300 behaves as an energy generation element that causes a change in pressure in ink inside the pressure chamber 12. The piezoelectric actuator 300 is called also as a piezoelectric element and refers to a portion that includes the diaphragm plate 50, the first electrode 60, the piezoelectric substance layer 70, and the second electrode 80.

The piezoelectric actuator 300 has a portion at which piezoelectric deformation occurs in the piezoelectric substance layer 70 when a voltage is applied between the first electrode 60 and the second electrode 80. This portion is referred to as an active portion 310. In the present embodiment, as will be described in detail later, the active portion 310 is formed individually for each pressure chamber 12. This means that the piezoelectric actuator 300 has a plurality of active portions 310. In general, either one of two electrodes of the active portion 310 is configured as a common electrode that is common to the plurality of active portions 310. The other of the two electrodes is configured as an individual electrode provided independently for each active portion 31. In the present embodiment, the first electrode 60 is a common electrode, and the second electrode 80 is an individual electrode. However, they may be reversed with each other. In the example described above, the diaphragm plate 50 and the first electrode 60 behave as a diaphragm plate. However, of course, the scope of the present disclosure is not limited to this example. For example, the diaphragm plate 50 may be omitted, and the first electrode 60 may solely behave as a diaphragm plate. The piezoelectric actuator 300 may have an additional function of practically behaving as a diaphragm plate.

In the present embodiment, an area that is a part of the diaphragm plate 50 and faces the pressure chamber 12 is referred to as a movable area C. An area that is a part of the movable area C, is located inside the compartment wall, meaning the end of the pressure chamber 12, in a plan view taken along the Z direction, and does not include the center part of the pressure chamber 12 is referred to as a peripheral region B. The piezoelectric actuator 300 is provided at the peripheral region B. An area that is a part of the movable area C and does not include peripheral region B is referred to as a center region A. The piezoelectric actuator 300 is not provided at the center region A.

The diaphragm plate 50 has the regional structure described above, and the active portion 310 is provided at the peripheral region B in the movable area C of the diaphragm plate 50 (see FIG. 4). Moreover, in the present embodiment, the active portion 310 extends to the outside of the peripheral region B, that is, to the outside beyond the pressure chamber 12. The active portion 310 is not provided at the center region A.

As illustrated in FIG. 3, the shape of the active portion 310 in a plan view is substantially the same as the shape of the pressure chamber 12, namely, a ellipse-like corner-rounded rectangular shape whose longer sides extend in the Y direction. The shape of the active portion 310 in a plan view is a loop shape.

Specifically, the first electrode 60 is provided continuously from an end to an end of the plurality of pressure chambers 12 and serves as a common electrode that is common to the plurality of active portions 310 of the piezoelectric actuator 300. The width, in the Y direction, of the first electrode 60, which is provided continuously from an end to an end of the plurality of pressure chambers 12 arranged next to one another in the X direction, is greater than the length of the pressure chamber 12 in the Y direction. The first electrode 60 is not provided at the center region A of the diaphragm plate 50. The end of the first electrode 60 closer to the center region A is covered by the piezoelectric substance layer 70. Needless to mention, the first electrode 60 may be provided at the center region A of the diaphragm plate 50.

The piezoelectric substance layer 70 is provided continuously in the X direction such that it has a predetermined width in the Y direction. The width of the piezoelectric substance layer 70 in the Y direction is greater than the length of the pressure chamber 12 in the Y direction. Therefore, as viewed in the Y direction with respect to the pressure chamber 12, the piezoelectric substance layer 70 extends to the outside of the pressure chamber 12. Although the piezoelectric substance layer 70 is provided continuously in the X direction from an end to an end of the plurality of pressure chambers 12 in the present embodiment, the scope of the present disclosure is not limited to this example. The piezoelectric substance layer 70 may have a segmented structure for separation at each wall portion between two adjacent pressure chambers 12 such that segments correspond to the pressure chambers 12 respectively.

The piezoelectric substance layer 70 is made of a piezoelectric oxide material having a polarization structure formed on the first electrode 60. For example, the piezoelectric substance layer 70 may be made of perovskite-type oxide represented by a general formula $ABO_3$. A lead-based piezoelectric material containing lead or a lead-free piezoelectric material not containing lead may be used as the material of the piezoelectric substance layer 70.

The second electrode 80 has a segmented structure for separation for each pressure chamber 12 and is provided as an individual electrode independently for each active portion 310 of the piezoelectric actuator 300. In a plan view taken along the Z direction, the second electrode 80 has a loop shape. That is, similarly to the pressure chamber 12, the second electrode 80 has a contour shape of a corner-rounded rectangle whose longer sides extend in the Y direction, with an open area having a shape substantially similar to the contour shape left at its center, like a ellipse. The rim of the second electrode 80 defines the boundary of the active portion 310. That is, the second electrode 80 is provided at the peripheral region B in the movable area C of the diaphragm plate 50 (see FIG. 2) and at the region outside the peripheral region B, that is, at the region outside the pressure chamber 12. The second electrode 80 is not provided at the center region A. The thickness of the second electrode 80 may be 100 nm or less. If the thickness of the second electrode 80 is 100 nm or less, it is possible to prevent the second electrode 80 from impeding the deformation of the active portion 310, thereby preventing a decrease in amount of deformative action of the active portion 310. The second electrode 80 may be made of at least one material selected from a group consisting of Pt, Ir, and Au. By using at least one material selected from a group consisting of Pt, Ir, and Au as the material of the second electrode 80, it is possible to decrease the electric resistance of the second electrode 80 and thus reduce a voltage drop.

The piezoelectric actuator 300 is covered by a protective film 200. A moisture-resistant insulating material can be used as the material of the protective film 200. In the present embodiment, the protective film 200 is provided continuously in such a way as to cover the top of the first electrode 60, the side of the piezoelectric substance layer 70, the side and top of the second electrode 80, and the center region A of the diaphragm plate 50. Although the center region A of the diaphragm plate 50 is covered by the protective film 200 in the present embodiment, the scope of the present disclosure is not limited to this example. The protective film 200 may be provided in such a way as not to cover a part or a whole of the center region A of the diaphragm plate 50. By providing the protective film 200 in such a way as not to cover a part or a whole of the center region A of the diaphragm plate 50, it is possible to prevent the protective film 200 from impeding the deformation of the diaphragm plate 50, thereby preventing a decrease in amount of deformative action.

Since the side of the piezoelectric substance layer 70 is covered by the protective film 200 as described above, it is possible to prevent the leakage of an electric current between the first electrode 60 and the second electrode 80 and thus prevent the piezoelectric actuator 300 from being damaged due to, for example, burning by a leak current. Moreover, since the protective film 200 is provided, it is possible to prevent a short-circuit fault between the first electrode 60 and the second electrode 80 by a lead electrode 90 that is an example of lead-out wiring that will be described in detail later.

Various moisture-resistant materials such as a moisture-resistant inorganic insulating material or a moisture-resistant organic insulating material can be used as the material of the protective film 200.

At least one kind selected from among silicon oxide ($SiO_x$), zirconium oxide ($ZrO_x$), tantalum oxide ($TaO_x$), aluminum oxide ($AlO_x$), and titanium oxide ($TiO_x$) is an example of an inorganic insulating material that can be used as the material of the protective film 200. Among others, aluminum oxide ($AlO_x$) that is an inorganic amorphous material, for example, alumina ($Al_2O_3$), may be used as the inorganic insulating material for forming the protective film 200. The protective film 200 made of such an inorganic insulating material can be formed by, for example, an MOD method, a sol-gel method, a sputtering method, or a CVD method, to name but a few.

At least one kind selected from among epoxy resin, polyimide resin, silicon resin, and fluorocarbon resin is an example of an organic insulating material that can be used as the material of the protective film 200. The protective film 200 made of such an organic insulating material can be formed by, for example, a spin coating method or a spray method, to name but a few.

A lead electrode 90 that is an example of lead-out wiring routed from each electrode of the piezoelectric actuator 300 is provided on the protective film 200. The lead electrode 90 includes an individual lead electrode 91 routed from the second electrode 80 and a common lead electrode 92 routed from the first electrode 60. To form the lead electrode 90, a material that contains at least one selected from a group consisting of Pt, Ir, Au, ITO, Cu, Al, Al—Cu, and Al—Nd may be used. The lead electrode 90 may contain a close contact layer for enhancing close contact with the protective film 200.

One end of the common lead electrode 92 is connected to the first electrode 60 via a contact hole 201 formed through the protective film 200 at an end in the X direction.

One end of the individual lead electrode 91 is connected to the second electrode 80. The other end of the individual lead electrode 91 is connected to an external wire connected to an external driver circuit that is not illustrated. A drive signal from the external driver circuit is supplied to the second electrode 80 through the individual lead electrode 91.

The individual lead electrode 91 described above is multiple-connected to the second electrode 80 that is the individual electrode of one active portion 310.

Specifically, one individual lead electrode 91 according to the present embodiment includes one first portion 911 and two second portions 912 connected to the first portion 911.

An external wire that is not illustrated is connected to one end of the first portion 911. Two second portions 912 are provided in each one individual lead electrode 91. One end of each of the two second portions 912 is connected to the other end of the first portion 911. The other end of each of the two second portions 912 is connected to the second electrode 80 via a contact hole 201 formed through the protective film 200. That is, the individual lead electrode 91 according to the present embodiment has a structure of a single wire main with a fork in the middle, thereby having one end to which a wiring substrate is connected and two ends connected to the second electrode 80. In the present embodiment, the joint where the individual lead electrode 91 is connected to the second electrode 80 is referred to as "connection portion". That is, in the present embodiment, two connection portions 912a are provided for the second electrode 80 that is the individual electrode of one active portion 31. The meaning of the statement "two connection portions 912a are provided" is that the connection portions 912a are provided independently and non-continuously of each other, with a predetermined distance therebetween.

As explained above, the meaning of the statement "the individual lead electrode 91 is multiple-connected to the second electrode 80 that is the individual electrode of one active portion 310" is that a plurality of connection portions 912a for connecting the individual lead electrode 91 to the second electrode 80 is provided.

In the present embodiment, the two connection portions 912a are located at the same position as viewed in the Y direction, which is the longer-side direction of the active portion 310, and at a distance from each other as viewed in the X direction, which is the shorter-side direction of the active portion 310.

In the above structure, it is possible to supply a drive signal from the plurality of connection portions 912a to the second electrode 80 through the individual lead electrode 91 and, therefore, it is possible to reduce a voltage drop in the in-plane direction including the X direction and the Y direction of the second electrode 80. By reducing a voltage drop of the second electrode 80, it is possible to prevent an unbalanced distribution of electric field intensity in the in-plane direction of the active portion 310, thereby preventing the occurrence of crack damage or burn damage due to electric field concentration. Moreover, since it is possible to reduce a voltage drop of the second electrode 80 without any need for increasing the thickness of the second electrode 80 to decrease electric resistance, it is possible to reduce a decrease in amount of deformative action of the active portion 310 by making the second electrode 80 thinner, thereby improving efficiency in deformative action of the active portion 310, meaning that a large amount of deformative action can be obtained with a low drive voltage.

Furthermore, in the present embodiment, since the two connection portions 912a are provided on only one side in the Y direction, which is the longer-side direction of the active portion 310, there is no need to route the individual lead electrode 91 between active portions 310 located adjacent to each other in the X direction. Therefore, it is unnecessary to leave a distance for the individual lead electrode 91 in arranging the active portions 310 located adjacent to each other in the X direction. This makes it possible to arrange the active portions 310 densely in the X direction. Moreover, since the wire-routing of the individual lead electrode 91 will be made easier, it is possible to prevent an increase in electric resistance otherwise caused due to an increase in the length of the individual lead electrode 91, thereby preventing the individual lead electrode 91 from causing a voltage drop. The second portions 912 of the individual lead electrode 91 according to the present embodiment have the same length as each other. Because of the same length, it is possible to apply the same voltage from the two connection portions 912a to the second electrode 80. This also contributes to preventing an unbalanced distribution of electric field intensity in the in-plane direction of the active portion 310.

As explained above, the piezoelectric actuator 300 according to the present embodiment includes: the diaphragm plate 50; the first electrode 60 provided on or over the diaphragm plate 50; the piezoelectric substance layer 70 provided on or over the first electrode 60; and the second electrode 80 provided on or over the piezoelectric substance layer 70; wherein the piezoelectric substance layer 70 includes a plurality of active portions 310 sandwiched between the first electrode 60 and the second electrode 80, either one of the first electrode 60 and the second electrode 80 is an individual electrode provided individually for each of the plurality of active portions 310, the other of the first electrode 60 and the second electrode 80 is a common electrode that is common to the plurality of active portions 310, and the individual lead electrode 91 that is lead-out wiring is multiple-connected to the individual electrode.

Since the individual lead electrode 91 is multiple-connected to the single individual electrode, it is possible to reduce a voltage drop in the plane of the individual electrode and prevent an unbalanced distribution of electric field intensity on the active portion 310, thereby preventing the occurrence of crack damage or burn damage due to current concentration. Moreover, since it is possible to reduce a voltage drop even if the electric resistance of the individual electrode is high, it is possible to make the individual electrode relatively thin. The thinner structure prevents the individual electrode from impeding the deformation of the active portion 310, thereby preventing a decrease in amount of deformative action of the active portion 310.

In the piezoelectric actuator 300 according to the present embodiment, the active portion 310 may be absent (i.e., not provided) at the center region A of the diaphragm plate 50. If the active portion 310 is not provided at the center region A of the diaphragm plate 50, the size in the in-plane direction including the X direction and the Y direction of the pressure chamber 12 tends to be relatively large, and the area of the active portion 310 also tends to be relatively large. Although a voltage drop of the individual electrode is more prone to occur when the active portion 310 has comparatively large area size, by virtue of multiple-connection of the individual lead electrode 91 to the single individual electrode, it is possible to reduce a voltage drop in the plane of the individual electrode and prevent an unbalanced distribution of electric field intensity on the active portion 310.

In the piezoelectric actuator 300 according to the present embodiment, either the first electrode 60 or the second electrode 80, or both, may be absent at the center region A. Since the electrode(s) is not provided at the center region A, this structure prevents deformation at the center region A from being impeded, thereby preventing a decrease in amount of deformative action. Moreover, although it is more susceptible to the occurrence of crack damage or burn damage due to current concentration because a drive voltage is not applied to the center region A due to the absence of the electrode(s) at the center region A, since the individual lead electrode 91 is multiple-connected to the single individual electrode, it is possible to reduce a voltage drop in the plane of the individual electrode and prevent an unbalanced distribution of electric field intensity on the active portion 310.

In the piezoelectric actuator 300 according to the present embodiment, the piezoelectric substance layer 70 may be absent at the center region A. Since the piezoelectric substance layer 70 is not provided at the center region A, this structure prevents deformation at the center region A from being impeded, thereby preventing a decrease in amount of deformative action. Moreover, although it is more susceptible to the occurrence of crack damage or burn damage due to current concentration because a drive voltage is not applied to the center region A due to the absence of the piezoelectric substance layer 70 at the center region A, since the individual lead electrode 91 is multiple-connected to the single individual electrode, it is possible to reduce a voltage drop in the plane of the individual electrode and prevent an unbalanced distribution of electric field intensity on the active portion 310.

In the piezoelectric actuator 300 according to the present embodiment, in a plan view taken along the Z direction, in which the first electrode 60, the piezoelectric substance layer 70, and the second electrode 80 are stacked, a plurality of connection portions 912a for connecting the individual lead electrode 91 that is a plurality of lead-out wiring to the second electrode 80 that is the single individual electrode may be provided at a distance from each other as viewed in the X direction, which is the shorter-side direction of the active portion 310. By arranging the plurality of connection portions 912a in the X direction, which is the shorter-side direction of the active portion 310, it is possible to prevent the occurrence of crack damage or burn damage to the active portion 310.

In the piezoelectric actuator 300 according to the present embodiment, the thickness of the second electrode 80 that is the individual electrode may be 100 nm or less. This structure prevents the second electrode 80 that is the individual electrode from impeding the deformation of the active portion 310, thereby preventing a decrease in amount of deformative action of the active portion 310.

In the piezoelectric actuator 300 according to the present embodiment, a material of the second electrode 80 that is the individual electrode may contain at least one selected from a group consisting of Pt, Ir, and Au. Using the above material as the material of the second electrode 80 that is the individual electrode makes it possible to decrease the electric resistance of the second electrode 80 and thus reduce a voltage drop.

In the piezoelectric actuator 300 according to the present embodiment, a material of the individual lead electrode 91 that is lead-out wiring may contain at least one selected from a group consisting of Pt, Ir, Au, ITO, Cu, Al, Al—Cu, and Al—Nd. Using the above material as the material of the individual lead electrode 91 makes it possible to decrease the electric resistance of the individual lead electrode 91 and thus reduce a voltage drop caused by the individual lead electrode 91.

The ink jet recording head 1, which is an example of a liquid ejecting head according to the present embodiment, includes the piezoelectric actuator 300 described above. This structure makes it possible to provide the ink jet recording head 1 that offers improved reliability by preventing the occurrence of damage such as burning or cracking to the piezoelectric actuator 300 and offers improved ink droplet ejection performance by improving the amount of deformative actuation of the piezoelectric actuator 300.

Second Embodiment

Figure 5:
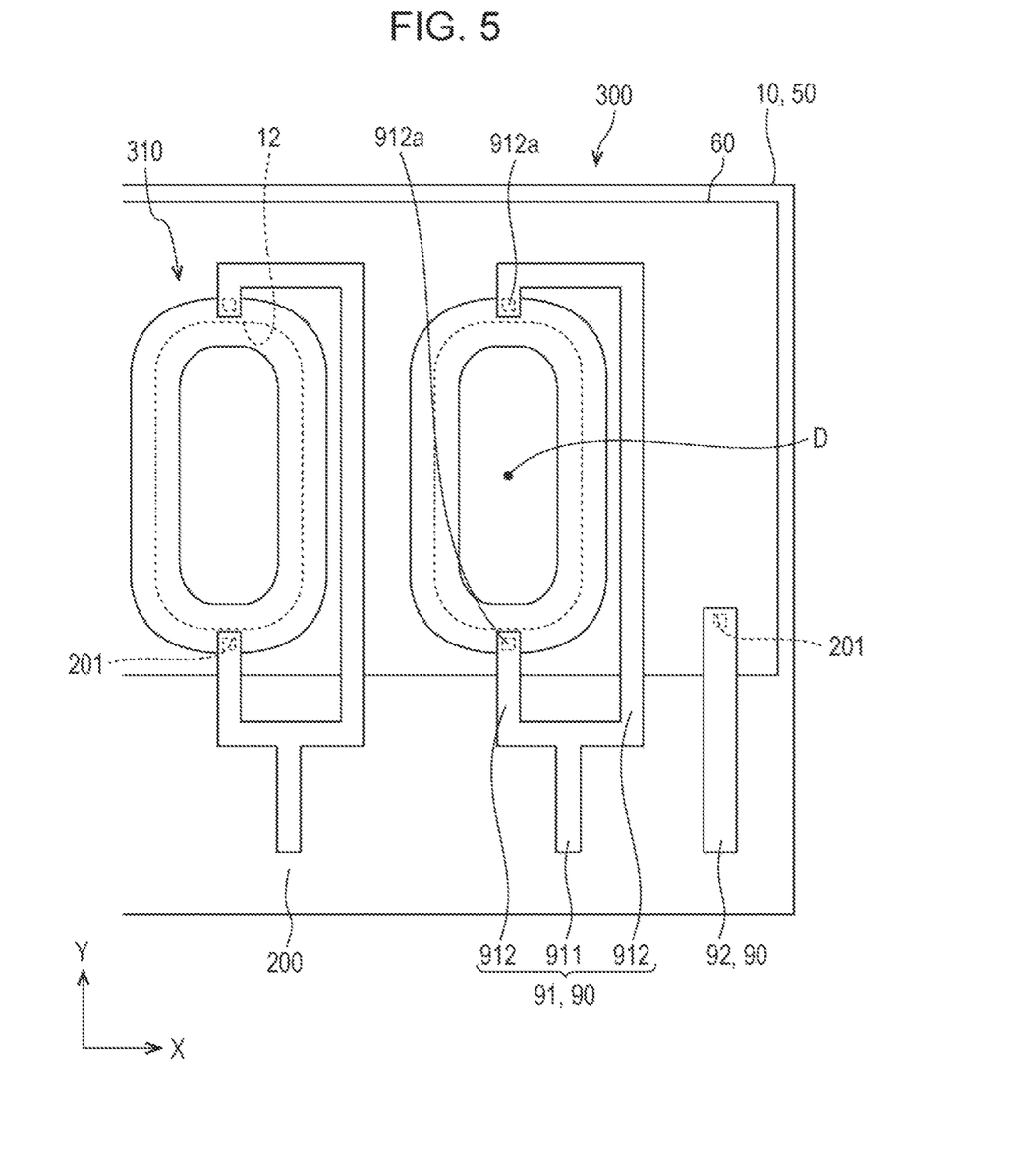
FIG. 5 is a plan view of a piezoelectric actuator according to a second embodiment of the present disclosure.

FIG. 5 is a top view of a piezoelectric actuator of an ink jet recording head that is an example of a liquid ejecting head according to a second embodiment of the present disclosure. The same members as those described in the foregoing embodiment are labeled with the same reference numerals, and the same description will not be given.

As illustrated in FIG. 5, the individual lead electrode 91, which is connected to the second electrode 80, and the common lead electrode 92, which is connected to the first electrode 60, are provided to constitute the lead electrode 90 for the piezoelectric actuator 300.

One individual lead electrode 91 includes one first portion 911 and two second portions 912. Therefore, the individual lead electrode 91 is connected to the second electrode 80 at the respective ends of two connection portions 912a. The second electrode 80 and the individual lead electrode 91 are connected to each other via the two connection portions 912a.

In a plan view taken along the Z direction, the two connection portions 912a to which the second portions 912 and the second electrode 80 are connected are provided at positions between which the center region A of the diaphragm plate 50 is located as viewed in the Y direction, which is the longer-side direction of the active portion 310.

The two connection portions 912a are located at the same position as viewed in the X direction, which is the shorter-side direction of the active portion 310, and at a distance from each other as viewed in the Y direction, which is the longer-side direction of the active portion 310. Since the two connection portions 912a are located at a distance from each other as viewed in the Y direction, which is the longer-side direction of the active portion 310, it is possible to reduce a voltage drop that is prone to occur especially in the longer-side direction of the active portion 310. That is, if the connection portions 912a are provided on only one side in the longer-side direction of the active portion 310, the voltage decreases as it goes toward the other side in the longer-side direction, resulting in a significant imbalance in the distribution of electric field intensity. In the present embodiment, since the two connection portions 912a are located at a distance from each other in the longer-side direction, it is possible to reduce a voltage drop that is prone to occur especially in the longer-side direction and prevent an unbalanced distribution of electric field intensity, thereby preventing the occurrence of crack damage or burn damage.

One of the two second portions 912 is routed between the active portions 310 located adjacent to each other in the X direction to extend toward one side in the Y direction, and is connected to the first portion 911.

As explained above, the piezoelectric actuator 300 according to the present embodiment includes: the diaphragm plate 50; the first electrode 60 provided on or over the diaphragm plate 50; the piezoelectric substance layer 70 provided on or over the first electrode 60; and the second electrode 80 provided on or over the piezoelectric substance layer 70; wherein the piezoelectric substance layer 70 includes a plurality of active portions 310 sandwiched between the first electrode 60 and the second electrode 80, either one of the first electrode 60 and the second electrode 80 is an individual electrode provided individually for each of the plurality of active portions 310, the other of the first electrode 60 and the second electrode 80 is a common electrode that is common to the plurality of active portions 310, and the individual lead electrode 91 that is lead-out wiring is multiple-connected to the individual electrode.

Since the individual lead electrode 91 is multiple-connected to the single individual electrode, it is possible to reduce a voltage drop in the plane of the individual electrode and prevent an unbalanced distribution of electric field intensity on the active portion 310, thereby preventing the occurrence of crack damage or burn damage due to current concentration. Moreover, since it is possible to reduce a voltage drop even if the electric resistance of the individual electrode is high, it is possible to make the individual electrode relatively thin. The thinner structure prevents the individual electrode from impeding the deformation of the active portion 310, thereby preventing a decrease in amount of deformative action of the active portion 310.

In the piezoelectric actuator 300 according to the present embodiment, in a plan view taken along the Z direction, in which the first electrode 60, the piezoelectric substance layer 70, and the second electrode 80 are stacked, a plurality of connection portions 912a for connecting the individual lead electrode 91 that is a plurality of lead-out wiring to the second electrode 80 that is the single individual electrode may be provided at positions between which the center region A is located. With this structure, although it is more susceptible to the occurrence of crack damage or burn damage due to current concentration because a drive voltage is not applied to the center region A due to the absence of the electrode(s) at the center region A, since the connection portions 912a are provided at positions between which the center region A is located, it is possible to reduce a voltage drop in the plane of the individual electrode and prevent an unbalanced distribution of electric field intensity on the active portion 310.

In the piezoelectric actuator 300 according to the present embodiment, in a plan view taken along the direction in which the first electrode 60, the piezoelectric substance layer 70, and the second electrode 80 are stacked, a plurality of connection portions 912a for connecting the individual lead electrode 91 that is a plurality of lead-out wiring to the second electrode 80 that is the single individual electrode may be provided at a distance from each other as viewed in the Y direction, which is the longer-side direction of the active portion 310. Since the two connection portions 912a are located at a distance from each other as viewed in the longer-side direction of the active portion 310, it is possible to reduce a voltage drop that is prone to occur especially in the longer-side direction of the active portion 310 and prevent an unbalanced distribution of electric field intensity, thereby preventing the occurrence of crack damage or burn damage.

In the piezoelectric actuator 300 according to the present embodiment, in a plan view taken along the Z direction, in which the first electrode 60, the piezoelectric substance layer 70, and the second electrode 80 are stacked, a plurality of connection portions 912a for connecting the individual lead electrode 91 that is a plurality of lead-out wiring to the second electrode 80 that is the single individual electrode may be provided at point-symmetric positions with respect to a point D on the center region A. By arranging the plurality of connection portions 912a at distant positions that are symmetric with respect to the point, it is possible to reduce a voltage drop that is prone to occur especially at a distant region and prevent an unbalanced distribution of electric field intensity, thereby preventing the occurrence of crack damage or burn damage.

Third Embodiment

Figure 6:
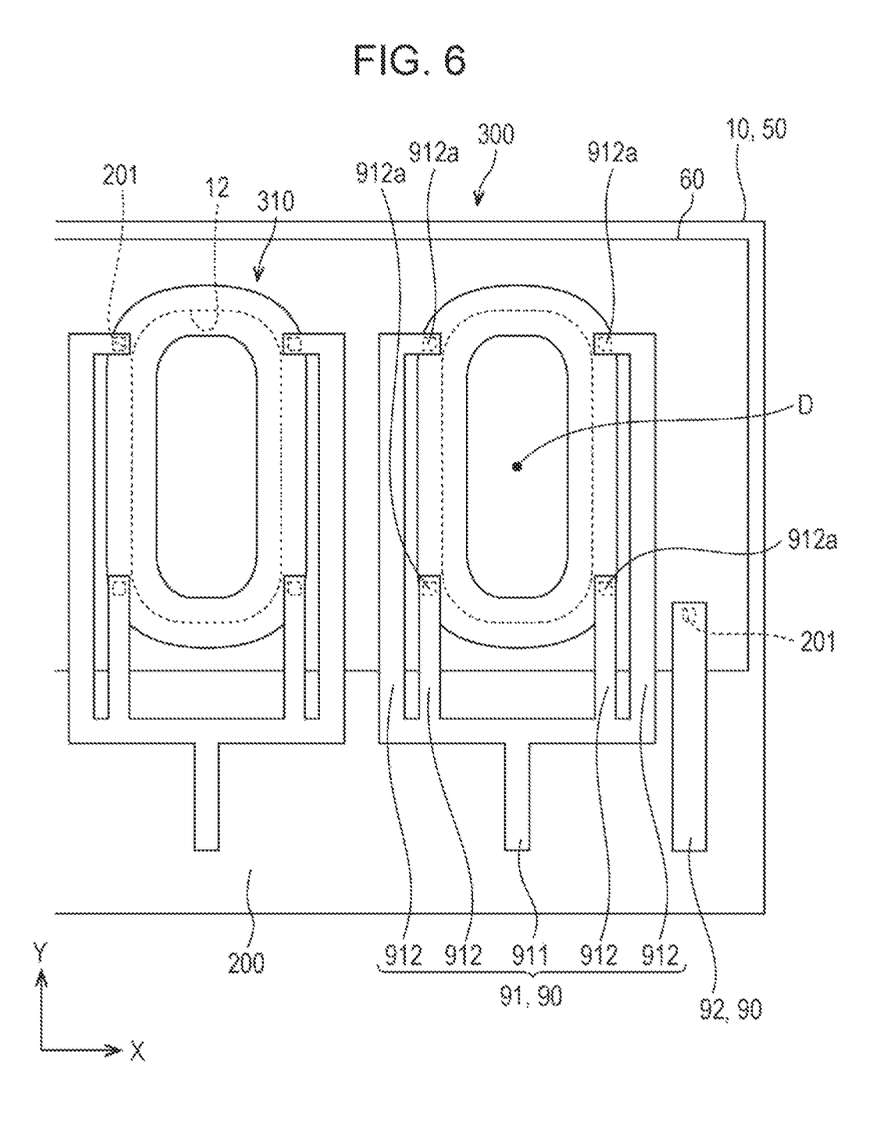
FIG. 6 is a plan view of a piezoelectric actuator according to a third embodiment of the present disclosure.

FIG. 6 is a top view of a piezoelectric actuator of an ink jet recording head that is an example of a liquid ejecting head according to a third embodiment of the present disclosure. The same members as those described in the foregoing embodiments are labeled with the same reference numerals, and the same description will not be given.

As illustrated in FIG. 6, the individual lead electrode 91, which is connected to the second electrode 80, and the common lead electrode 92, which is connected to the first electrode 60, are provided to constitute the lead electrode 90 for the piezoelectric actuator 300.

One individual lead electrode 91 includes one first portion 911 and four second portions 912. Therefore, the individual lead electrode 91 is connected to the second electrode 80 at the respective ends of four connection portions 912a. The second electrode 80 and the individual lead electrode 91 are connected to each other via the four connection portions 912a.

In a plan view taken along the Z direction, the four connection portions 912a are located near the four corners of the active portion 310 respectively. That is, the four connection portions 912a are provided at the +X, +Y directional corner, the +X, -Y directional corner, the -X, +Y directional corner, and the -X, -Y directional corner of the active portion 310 respectively.

Among the four connection portions 912a, two connection portions 912a that are located adjacent to each other in the X direction, which is the shorter-side direction of the active portion 310, are located at the same position as viewed in the Y direction, which is the longer-side direction of the active portion 310, and at a distance from each other as viewed in the X direction.

Among the four connection portions 912a, two connection portions 912a that are located adjacent to each other in the Y direction, which is the longer-side direction of the active portion 310, are located at the same position as viewed in the X direction, which is the shorter-side direction of the active portion 310, and at a distance from each other as viewed in the Y direction.

In the present embodiment, in a plan view taken along the Z direction, there are two groups each consisting of two connection portions 912a provided at point-symmetric positions with respect to a point D, which is the center of symmetry, on the center region A of the diaphragm plate 50. Specifically, the connection portion 912a provided at the +X, +Y directional corner of the active portion 310 and the connection portion 912a provided at the -X, -Y directional corner thereof are at point-symmetric positions with respect to the point D as the center of symmetry. The connection portion 912a provided at the +X, -Y directional corner of the active portion 310 and the connection portion 912a provided at the -X, +Y directional corner thereof are at point-symmetric positions with respect to the point D as the center of symmetry.

Two of the four second portions 912 are routed each between the active portions 310 located adjacent to each other in the X direction to extend toward one side in the Y direction, and are connected to the first portion 911.

It is possible to reduce a voltage drop of the second electrode 80 by providing a plurality of connection portions 912a for connection to the second electrode 80, specifically, four connection portions 912a in the present embodiment.

As explained above, the piezoelectric actuator 300 according to the present embodiment includes: the diaphragm plate 50; the first electrode 60 provided on or over the diaphragm plate 50; the piezoelectric substance layer 70 provided on or over the first electrode 60; and the second electrode 80 provided on or over the piezoelectric substance layer 70; wherein the piezoelectric substance layer 70 includes a plurality of active portions 310 sandwiched between the first electrode 60 and the second electrode 80, either one of the first electrode 60 and the second electrode 80 is an individual electrode provided individually for each of the plurality of active portions 310, the other of the first electrode 60 and the second electrode 80 is a common electrode that is common to the plurality of active portions 310, and the individual lead electrode 91 that is lead-out wiring is multiple-connected to the individual electrode.

Since the individual lead electrode 91 is multiple-connected to the single individual electrode, it is possible to reduce a voltage drop in the plane of the individual electrode and prevent an unbalanced distribution of electric field intensity on the active portion 310, thereby preventing the occurrence of crack damage or burn damage due to current concentration. Moreover, since it is possible to reduce a voltage drop even if the electric resistance of the individual electrode is high, it is possible to make the individual electrode relatively thin. The thinner structure prevents the individual electrode from impeding the deformation of the active portion 310, thereby preventing a decrease in amount of deformative action of the active portion 310.

In the piezoelectric actuator 300 according to the present embodiment, in a plan view taken along the Z direction, in which the first electrode 60, the piezoelectric substance layer 70, and the second electrode 80 are stacked, a plurality of connection portions 912a for connecting the individual lead electrode 91 that is a plurality of lead-out wiring to the second electrode 80 that is the single individual electrode may be provided at positions between which the center region A is located. With this structure, although it is more susceptible to the occurrence of crack damage or burn damage due to current concentration because a drive voltage is not applied to the center region A due to the absence of the electrode(s) at the center region A, since the connection portions 912a are provided at positions between which the center region A is located, it is possible to reduce a voltage drop in the plane of the individual electrode and prevent an unbalanced distribution of electric field intensity on the active portion 310.

In the piezoelectric actuator 300 according to the present embodiment, in a plan view taken along the direction in which the first electrode 60, the piezoelectric substance layer 70, and the second electrode 80 are stacked, a plurality of connection portions 912*a* for connecting the individual lead electrode 91 that is a plurality of lead-out wiring to the second electrode 80 that is the single individual electrode may be provided at a distance from each other as viewed in the Y direction, which is the longer-side direction of the active portion 310. Since the two connection portions 912*a* are located at a distance from each other as viewed in the longer-side direction of the active portion 310, it is possible to reduce a voltage drop that is prone to occur especially in the longer-side direction of the active portion 310 and prevent an unbalanced distribution of electric field intensity, thereby preventing the occurrence of crack damage or burn damage.

In the piezoelectric actuator 300 according to the present embodiment, in a plan view taken along the Z direction, in which the first electrode 60, the piezoelectric substance layer 70, and the second electrode 80 are stacked, a plurality of connection portions 912*a* for connecting the individual lead electrode 91 that is a plurality of lead-out wiring to the second electrode 80 that is the single individual electrode may be provided at a distance from each other as viewed in the X direction, which is the shorter-side direction of the active portion 310. By arranging the plurality of connection portions 912*a* in the X direction, which is the shorter-side direction of the active portion 310, it is possible to prevent the occurrence of crack damage or burn damage to the active portion 310.

In the piezoelectric actuator 300 according to the present embodiment, in a plan view taken along the Z direction, in which the first electrode 60, the piezoelectric substance layer 70, and the second electrode 80 are stacked, a plurality of connection portions 912*a* for connecting the individual lead electrode 91 that is a plurality of lead-out wiring to the second electrode 80 that is the single individual electrode may be provided at point-symmetric positions with respect to a point D on the center region A. By arranging the plurality of connection portions 912*a* at distant positions that are symmetric with respect to the point, it is possible to reduce a voltage drop that is prone to occur especially at a distant region and prevent an unbalanced distribution of electric field intensity, thereby preventing the occurrence of crack damage or burn damage.

Fourth Embodiment

Figure 7:
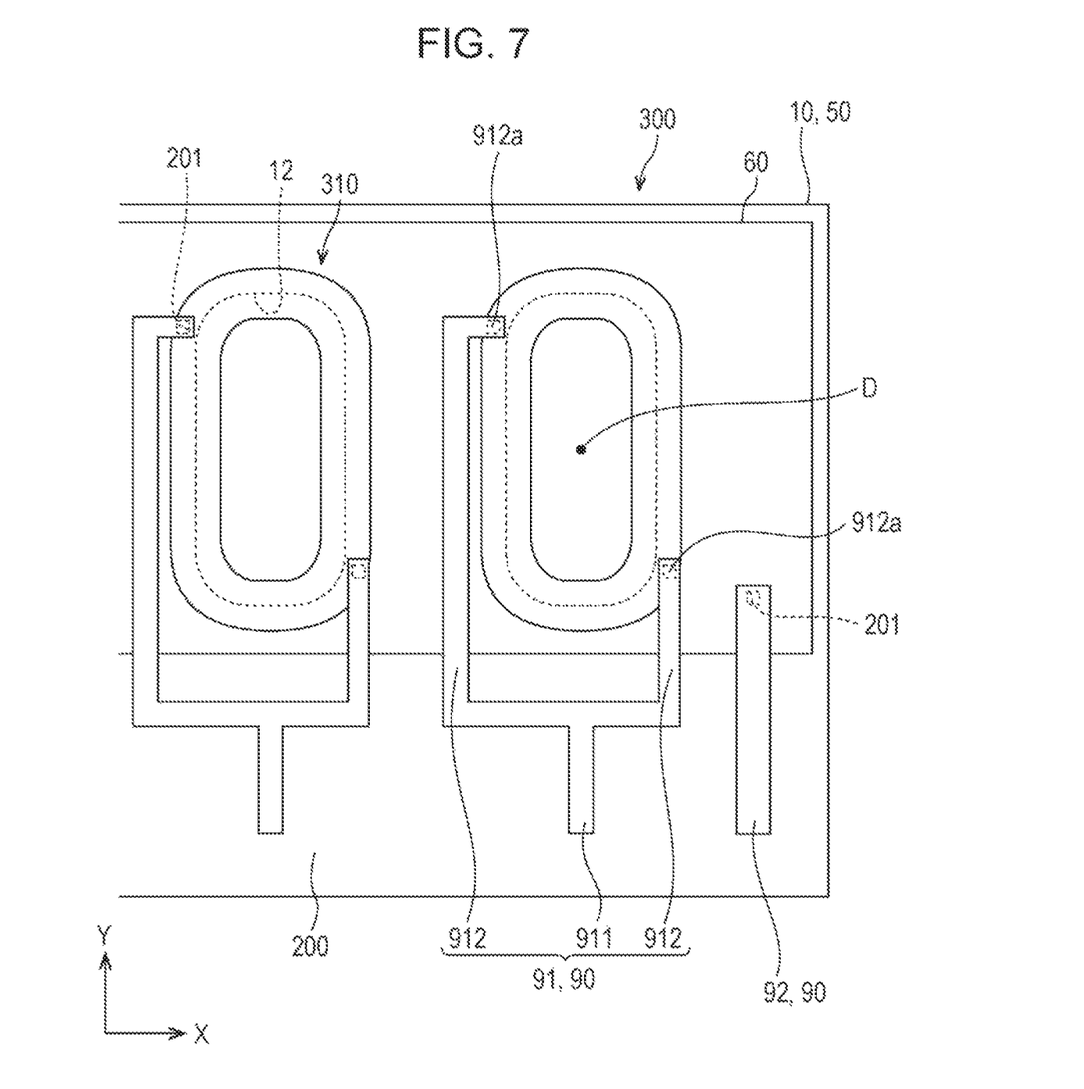
FIG. 7 is a plan view of a piezoelectric actuator according to a fourth embodiment of the present disclosure.

FIG. 7 is a top view of a piezoelectric actuator of an ink jet recording head that is an example of a liquid ejecting head according to a fourth embodiment of the present disclosure. The same members as those described in the foregoing embodiments are labeled with the same reference numerals, and the same description will not be given.

As illustrated in FIG. 7, the individual lead electrode 91, which is connected to the second electrode 80, and the common lead electrode 92, which is connected to the first electrode 60, are provided to constitute the lead electrode 90 for the piezoelectric actuator 300.

One individual lead electrode 91 includes one first portion 911 and two second portions 912. Therefore, the individual lead electrode 91 is connected to the second electrode 80 at the respective ends of two connection portions 912*a*. The second electrode 80 and the individual lead electrode 91 are connected to each other via the two connection portions 912*a*.

In a plan view taken along the Z direction, the two connection portions 912*a* are located near two diagonal corners of the active portion 310. That is, the two connection portions 912*a* are provided at the −X, +Y directional corner and the +X, −Y directional corner of the active portion 310 respectively.

In the present embodiment, in a plan view taken along the Z direction, the two connection portions 912*a* are provided at point-symmetric positions with respect to a point D, which is the center of symmetry, on the center region A of the diaphragm plate 50.

One of the two second portions 912 is routed between the active portions 310 located adjacent to each other in the X direction to extend toward one side in the Y direction, and is connected to the first portion 911.

As explained above, the piezoelectric actuator 300 according to the present embodiment includes: the diaphragm plate 50; the first electrode 60 provided on or over the diaphragm plate 50; the piezoelectric substance layer 70 provided on or over the first electrode 60; and the second electrode 80 provided on or over the piezoelectric substance layer 70; wherein the piezoelectric substance layer 70 includes a plurality of active portions 310 sandwiched between the first electrode 60 and the second electrode 80, either one of the first electrode 60 and the second electrode 80 is an individual electrode provided individually for each of the plurality of active portions 310, the other of the first electrode 60 and the second electrode 80 is a common electrode that is common to the plurality of active portions 310, and the individual lead electrode 91 that is lead-out wiring is multiple-connected to the individual electrode.

Since the individual lead electrode 91 is multiple-connected to the single individual electrode, it is possible to reduce a voltage drop in the plane of the individual electrode and prevent an unbalanced distribution of electric field intensity on the active portion 310, thereby preventing the occurrence of crack damage or burn damage due to current concentration. Moreover, since it is possible to reduce a voltage drop even if the electric resistance of the individual electrode is high, it is possible to make the individual electrode relatively thin. The thinner structure prevents the individual electrode from impeding the deformation of the active portion 310, thereby preventing a decrease in amount of deformative action of the active portion 310.

In the piezoelectric actuator 300 according to the present embodiment, in a plan view taken along the Z direction, in which the first electrode 60, the piezoelectric substance layer 70, and the second electrode 80 are stacked, a plurality of connection portions 912*a* for connecting the individual lead electrode 91 that is a plurality of lead-out wiring to the second electrode 80 that is the single individual electrode may be provided at positions between which the center region A is located. With this structure, although it is more susceptible to the occurrence of crack damage or burn damage due to current concentration because a drive voltage is not applied to the center region A due to the absence of the electrode(s) at the center region A, since the connection portions 912*a* are provided at positions between which the center region A is located, it is possible to reduce a voltage drop in the plane of the individual electrode and prevent an unbalanced distribution of electric field intensity on the active portion 310.

In the piezoelectric actuator 300 according to the present embodiment, in a plan view taken along the direction in which the first electrode 60, the piezoelectric substance layer 70, and the second electrode 80 are stacked, a plurality of connection portions 912*a* for connecting the individual lead electrode 91 that is a plurality of lead-out wiring to the second electrode 80 that is the single individual electrode may be provided at a distance from each other as viewed in the Y direction, which is the longer-side direction of the active portion 310. Since the two connection portions 912a are located at a distance from each other as viewed in the longer-side direction of the active portion 310, it is possible to reduce a voltage drop that is prone to occur especially in the longer-side direction of the active portion 310 and prevent an unbalanced distribution of electric field intensity, thereby preventing the occurrence of crack damage or burn damage.

In the piezoelectric actuator 300 according to the present embodiment, in a plan view taken along the Z direction, in which the first electrode 60, the piezoelectric substance layer 70, and the second electrode 80 are stacked, a plurality of connection portions 912a for connecting the individual lead electrode 91 that is a plurality of lead-out wiring to the second electrode 80 that is the single individual electrode may be provided at a distance from each other as viewed in the X direction, which is the shorter-side direction of the active portion 310. By arranging the plurality of connection portions 912a in the X direction, which is the shorter-side direction of the active portion 310, it is possible to prevent the occurrence of crack damage or burn damage to the active portion 310.

In the piezoelectric actuator 300 according to the present embodiment, in a plan view taken along the Z direction, in which the first electrode 60, the piezoelectric substance layer 70, and the second electrode 80 are stacked, a plurality of connection portions 912a for connecting the individual lead electrode 91 that is a plurality of lead-out wiring to the second electrode 80 that is the single individual electrode may be provided at point-symmetric positions with respect to a point D on the center region A. By arranging the plurality of connection portions 912a at distant positions that are symmetric with respect to the point, it is possible to reduce a voltage drop that is prone to occur especially at a distant region and prevent an unbalanced distribution of electric field intensity, thereby preventing the occurrence of crack damage or burn damage.

Other Embodiments

Although some embodiments of the present disclosure are explained above, the basic structure of the present disclosure is not limited to those described above.

For example, although it is assumed in each of the foregoing embodiments that the first electrode 60 is the common electrode that is common to the plurality of active portions 310 and that the second electrode 80 is the individual electrode of each active portion 310, the scope of the present disclosure is not limited to this example. The first electrode 60 may be the individual electrode of each active portion 310, and the second electrode 80 may be the common electrode that is common to the plurality of active portions 310. Even if the first electrode 60 is the individual electrode of each active portion 310, it is possible to reduce a voltage drop and prevent a decrease in amount of deformative action and reduce variation in amount of deformative action, without any need for increasing the thickness of the first electrode 60, by multiple-connecting the individual lead electrode 91 that is lead-out wiring to the first electrode 60.

In each of the foregoing embodiments, the first portion 911 of the individual lead electrode 91 extends in the Y direction. However, the scope of the present disclosure is not limited to this example. The first portion 911 may extend in the X direction.

In each of the foregoing embodiments, only one row of the pressure chambers 12 and the active portions 310 arranged next to one another in the X direction is provided in the flow passage forming substrate 10. However, the scope of the present disclosure is not limited to this example. A plurality of rows may be provided in the Y direction such that the pressure chambers 12 and the active portions 310 are arranged next to one another in the X direction to form each row. When a plurality of rows is provided in the Y direction such that the pressure chambers 12 and the active portions 310 are arranged next to one another in the X direction to form each row, two adjacent rows of the pressure chambers 12 and the active portions 310 may be shifted from each other in the X direction.

In each of the foregoing embodiments, none of the first electrode 60, the piezoelectric substance layer 70, and the second electrode 80 is provided at the center region A of the diaphragm plate 50. However, the scope of the present disclosure is not limited to this example. One of the first electrode 60 and the second electrode 80 may be provided at the center region A. The piezoelectric substance layer 70 may be provided at the center region A.

Figure 8:
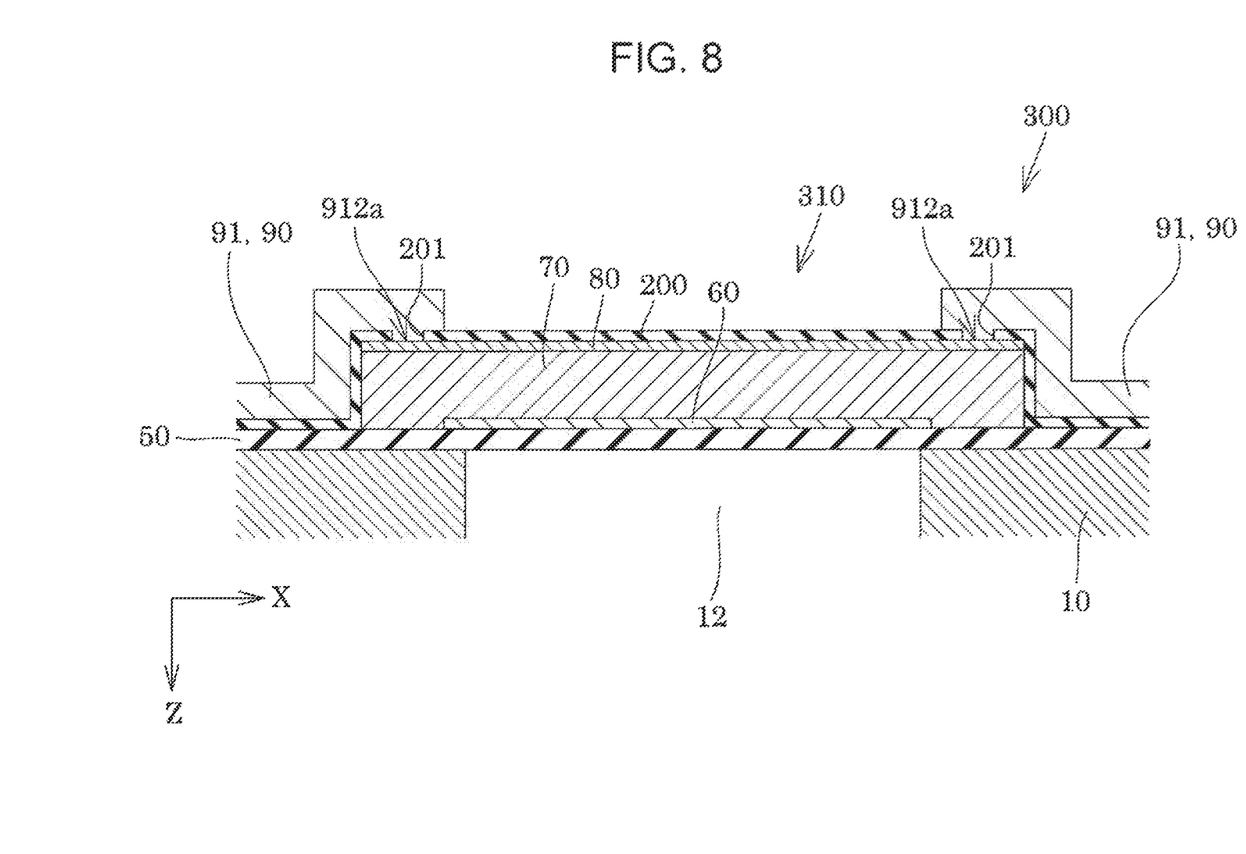
FIG. 8 is a sectional view of a recording head according to another embodiment of the present disclosure.

In each of the foregoing embodiments, the active portion 310 is not provided at the center region A of the diaphragm plate 50. However, the scope of the present disclosure is not limited to this example. With reference to FIG. 8, a variation example of the active portion 310 will now be explained. FIG. 8 is a sectional view taken along the line VIII-VIII of FIG. 1 to depict an ink jet recording head that is an example of a liquid ejecting head according to another embodiment of the present disclosure.

As illustrated in FIG. 8, the first electrode 60, the piezoelectric substance layer 70, the second electrode 80, the protective film 200, and the individual lead electrode 91 that is a constituent of the lead electrode 90 are provided on and over the diaphragm plate 50 on the flow passage forming substrate 10.

In a plan view taken along the Z direction, the first electrode 60, the piezoelectric substance layer 70, and the second electrode 80 are provided continuously across an area overlapping with the pressure chamber 12. That is, in a plan view taken along the Z direction, the active portion 310 is provided throughout the entire area overlapping with the pressure chamber 12.

The individual lead electrode 91 is connected to each of the two ends of the active portion 310 in the X direction. That is, two connection portions 912a for connecting the individual lead electrode 91 to the second electrode 80 are provided.

Even with the modified structure described above, by multiple-connection, two in the present embodiment, of the individual lead electrode 91 to the second electrode 80 that is the individual electrode of the active portion 310, it is possible to reduce a voltage drop due to the electric resistance of the second electrode 80 and prevent a decrease in amount of deformative action and reduce variation in amount of deformative action.

Figure 9:
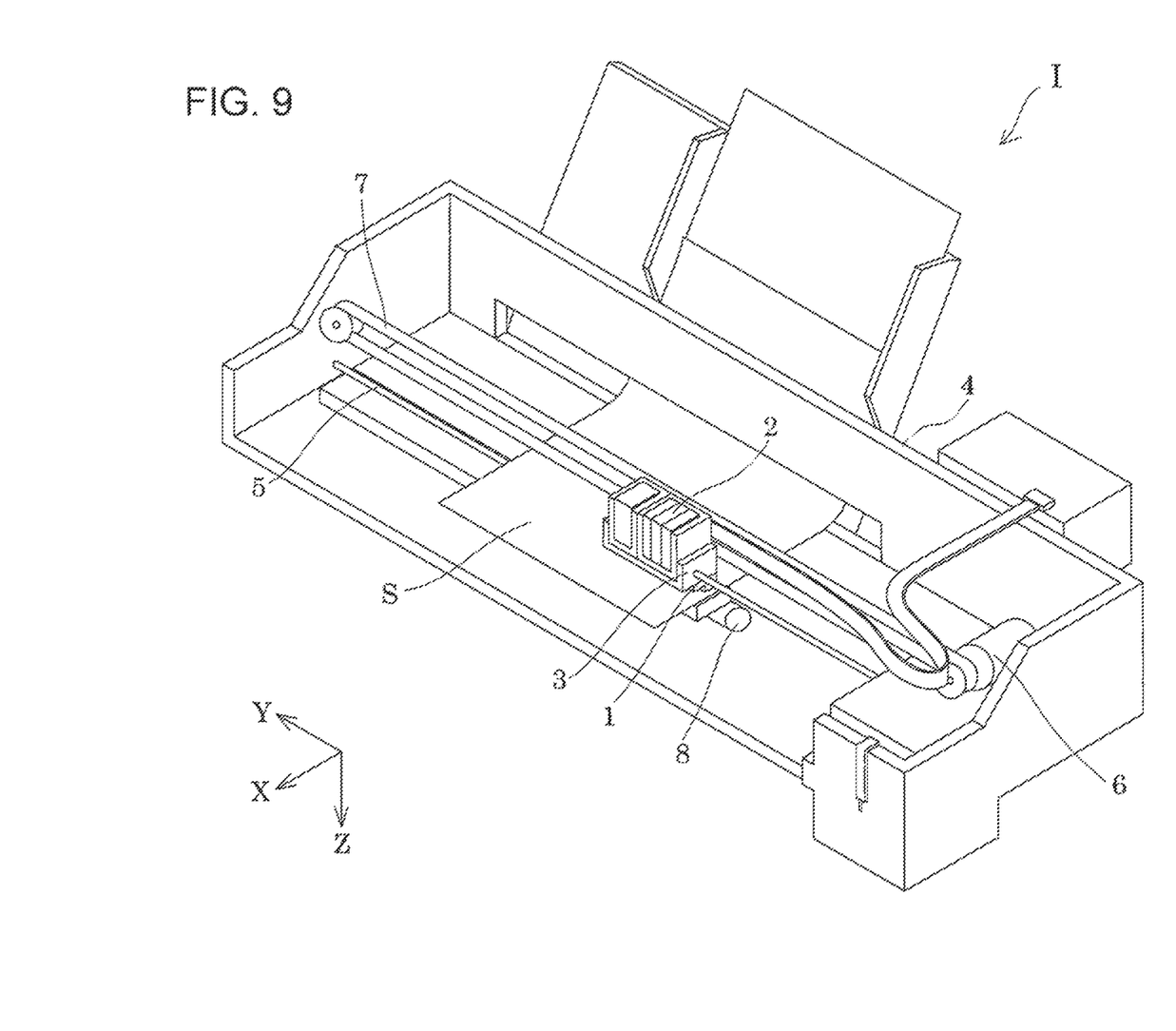
FIG. 9 is a schematic view of the structure of a recording apparatus according to an exemplary embodiment.

The recording head 1 described above is mounted on an ink jet recording apparatus I that is an example of a liquid ejecting apparatus. FIG. 9 is a schematic view of an example of an ink jet recording apparatus according to the present embodiment.

In the ink jet recording apparatus I illustrated in FIG. 9, cartridges 2 that constitute a liquid supply unit are detachably attached to the recording head 1. A carriage 3 on which the recording head 1 is mounted is configured to move freely in the axial direction along a carriage shaft 5 fixed to the body 4 of the apparatus.

The driving power of a driving motor 6 is transmitted to the carriage 3 through a plurality of gears, which is not illustrated, and a timing belt 7. Therefore, the carriage 3 on which the recording head 1 is mounted travels along the carriage shaft 5. A transporting roller 8 that is a transporting unit is provided on the body 4 of the apparatus. A recording sheet S that is a recording target medium such as paper is transported by the transporting roller 8. The transporting unit that transports the recording sheet S is not limited to the transporting roller 8. For example, the transporting unit may be a belt, a drum, or the like.

In the above example, cartridges 2 that constitute a liquid supply unit are mounted on the carriage 3. However, the structure of the ink jet recording apparatus I is not limited to this example. For example, a liquid supply unit such as an ink tank may be fixed to the body 4 of the apparatus, and the liquid supply unit may be connected to the recording head 1 through a supply conduit medium such as a tube. The liquid supply unit may be mounted somewhere other than the ink jet recording apparatus.

In the above example, the recording head 1 is mounted on the carriage 3 and is configured to move in the main-scan direction. However, the structure of the ink jet recording apparatus I is not limited to this example. For example, the disclosed technique may be applied to a so-called line-type recording apparatus in which the recording head 1 is fixed and printing is performed just by moving the recording sheet S such as paper in the sub-scan direction.

The present disclosure is directed to a wide variety of liquid ejecting heads and can be applied to, for example, a recording head such as various kinds of ink jet recording head used in an image recording apparatus such as a printer, a color material ejection head that is used in the production of color filters for a liquid crystal display, etc., an electrode material ejection head that is used for the electrode formation of an organic EL display, an FED, etc., a living organic material ejection head that is used for production of biochips, etc. Although the ink jet recording apparatus I is taken as an example of a liquid ejecting apparatus, the present disclosure can be applied to a liquid ejecting apparatus using the other liquid ejecting head described above.

The scope of application of the present disclosure is not limited to the piezoelectric actuator 300 used in a liquid ejecting head. The present disclosure may be applied to piezoelectric actuators used in other kinds of devices. Examples of other kinds of devices are: an ultrasonic device such as an ultrasonic transmitter, an ultrasonic motor, a temperature/electricity converter, a pressure/electricity converter, a ferroelectric transistor, a piezoelectric transformer, a cutoff filter for blocking harmful radiation such as infrared rays, an optical filter using photonic crystal effects obtained by forming quantum dots, an optical or other filter using thin-film optical coherence, various kinds of sensor such as an infrared sensor, an ultrasonic sensor, a heat-sensitive sensor, a pressure sensor, a pyroelectric sensor, a gyro sensor (angular velocity sensor), a ferroelectric memory, etc.

What is claimed is:

1. A piezoelectric actuator, comprising:
   a diaphragm plate;
   a first electrode;
   a second electrode; and
   a piezoelectric substance layer which includes a plurality of active portions sandwiched between the first electrode and the second electrode,
   wherein the diaphragm plate, the first electrode, the piezoelectric substance layer, and the second electrode are stacked in a stacking direction,
   the second electrode is provided individually for each of the plurality of active portions, and the first electrode is common to the plurality of active portions,
   a lead-out wiring is connected to the second electrode at multiple locations, the lead-out wiring including a first portion and a plurality of second portions that branch out from the first portion that extend to the multiple locations, each second portion being connected to the second electrode at a different location of the second electrode,
   each of the active portions are offset relative to a center region of the diaphragm plate sandwiched between the active portions,
   the second electrode is offset relative to the center region, and
   in a plan view taken along the stacking direction, the plurality of second portions of the lead-out wiring are connected to the second electrode at positions at which the center region is located therebetween.

2. The piezoelectric actuator according to claim 1, wherein the piezoelectric substance layer is offset relative to the center region.

3. The piezoelectric actuator according to claim 1, wherein, in a plan view taken along the stacking direction, the plurality of second portions for connecting the lead-out wiring to the second electrode are provided at a distance from each other in a longer-side direction of the active portion.

4. The piezoelectric actuator according to claim 1, wherein, in a plan view taken along the stacking direction the plurality of second portions for connecting the lead-out wiring to the second electrode are provided at a distance from each other in a shorter-side direction of the active portion.

5. The piezoelectric actuator according to claim 1, wherein, in a plan view taken along the stacking direction the plurality of second portions of the lead-out wiring are connected to the second electrode at point-symmetric positions with respect to a point located at the center region.

6. The piezoelectric actuator according to claim 1, wherein a thickness of the second electrode is 100 nm or less.

7. The piezoelectric actuator according to claim 1, wherein a material of the second electrode contains at least one selected from a group consisting of Pt, Ir, and Au.

8. The piezoelectric actuator according to claim 1, wherein a material of the lead-out wiring contains at least one selected from a group consisting of Pt, Ir, Au, ITO, Cu, Al, Al—Cu, and Al—Nd.

9. A liquid ejecting head, comprising:
   the piezoelectric actuator according to claim 1.

10. A liquid ejecting apparatus, comprising:
    the liquid ejecting head according to claim 9.

11. The piezoelectric actuator according to claim 3, wherein the center region is located between the plurality of second portions in the longer-side direction.

12. The piezoelectric actuator according to claim 5, wherein the center region is located between the plurality of second portions in the shorter-side direction.

* * * * *